(12) United States Patent
Yang et al.

(10) Patent No.: US 10,740,672 B2
(45) Date of Patent: Aug. 11, 2020

(54) CAPACITATIVE ARTIFICIAL NEURAL NETWORKS

(71) Applicant: University of Massachusetts, Boston, MA (US)

(72) Inventors: Jianhua Yang, Hadley, MA (US); Qiangfei Xia, Amherst, MA (US); Zhongrui Wang, Amherst, MA (US); Qing Wu, Manilus, NY (US); Mark R. McLean, Severna Park, MD (US)

(73) Assignee: Univerity of Massachusetts, Boston, MA (US)

( * ) Notice: Subject to any disclaimer, the term of this patent is extended or adjusted under 35 U.S.C. 154(b) by 0 days.

(21) Appl. No.: 16/371,736

(22) Filed: Apr. 1, 2019

(65) Prior Publication Data

US 2019/0303744 A1  Oct. 3, 2019

Related U.S. Application Data

(60) Provisional application No. 62/650,497, filed on Mar. 30, 2018.

(51) Int. Cl.
*G06N 3/04* (2006.01)
*H01L 45/00* (2006.01)
(Continued)

(52) U.S. Cl.
CPC .......... *G06N 3/04* (2013.01); *H01L 27/092* (2013.01); *H01L 28/65* (2013.01);
(Continued)

(58) Field of Classification Search
None
See application file for complete search history.

(56) References Cited

U.S. PATENT DOCUMENTS 7,608,905 B2   10/2009  Bratkovski et al.
9,231,209 B2 *  1/2016  Mares ............... H01L 45/08
(Continued)

OTHER PUBLICATIONS

Wang, Zhongrui, et al. "Memristors with Diffusive Dynamics as Synaptic Emulators for Neuromorphic Computing." Nature Materials, vol. 16, No. 1, 2016, pp. 101-108., doi:10.1038/nmat4756. (Year: 2016).*
(Continued)

*Primary Examiner* — J. E. Schoenholtz
(74) *Attorney, Agent, or Firm* — Fish & Richardson P.C.

(57) ABSTRACT

In one aspect, an apparatus includes a diffusive memristor, and a capacitor integrated in series with the diffusive memristor, wherein the apparatus exhibits volatile memcapacitive behavior. In another aspect, a device includes a transistor, and a memcapacitor integrated onto the gate of the transistor, wherein the memcapacitor exhibits volatile memcapacitive behavior. The memcapacitor includes a diffusive memristor, and a capacitor integrated in series with the diffusive memristor, wherein the gate dielectric of the transistor is replaced with the memcapacitor. In another aspect, an artificial neuron device includes a transistor, a volatile memcapacitor that is configured to operate as an electrically floating gate of the transistor, and one or more synaptic circuits that are coupled to the volatile memcapacitor. The volatile memcapacitor includes a diffusive memristor, and a capacitor integrated in series with the diffusive memristor.

20 Claims, 9 Drawing Sheets

(51) Int. Cl.
| | |
|---|---|
| H01L 49/02 | (2006.01) |
| H01L 29/51 | (2006.01) |
| H01L 29/423 | (2006.01) |
| H01L 27/092 | (2006.01) |
| H01L 29/49 | (2006.01) |
| H01L 29/788 | (2006.01) |

(52) U.S. Cl.
CPC .... *H01L 29/42324* (2013.01); *H01L 29/4958* (2013.01); *H01L 29/513* (2013.01); *H01L 29/517* (2013.01); *H01L 29/518* (2013.01); *H01L 29/788* (2013.01); *H01L 45/1233* (2013.01); *H01L 45/1253* (2013.01); *H01L 45/145* (2013.01); *H01L 45/146* (2013.01)

(56) References Cited

U.S. PATENT DOCUMENTS

| | | | |
|---|---|---|---|
| 10,424,731 B2* | 9/2019 | Suzuki | H01L 45/085 |
| 2011/0176353 A1* | 7/2011 | Li | B82Y 10/00 |
| | | | 365/148 |

OTHER PUBLICATIONS

Adda, et al. An artificial neuron founded on resistive switching of Mott insulators, in 2017 IEEE International Memory Workshop (IMW), pp. 1-4.
Alibart, et al. A Memristive Nanoparticle/Organic Hybrid Synapstor for Neuroinspired Computing, Advanced Functional Materials 22:609-616, (2012).
Bean, The action potential in mammalian central neurons, Nat Rev Neurosci 8:451-465 (2007).
Bi and Poo, Synaptic modification by correlated activity: Hebb's postulate revisited, Annual review of neuroscience 24:139-166, (2001).
Chance, et al., Gain Modulation from Background Synaptic Input, Neuron 35:773-782, (2002).
Chua, Memristor—The missing circuit element, IEEE Transactions on Circuit Theory 18:507-519 (1971).
Di Ventra, et al., Circuit Elements With Memory: Memristors, Memcapacitors, and Meminductors, Proceedings of the IEEE 97:1717-1724, (2009).
Hennecke, et al. Measuring power consumption on IBM Blue Gene/P, Computer Science—Research and Development 27:329-336 (2012).
Hodgkin and Huxley, A quantitative description of membrane current and its application to conduction and excitation in nerve, The Journal of Physiology 117:500-544, (1952).
Indiveri, et al., A VLSI array of low-power spiking neurons and bistable synapses with spike-timing dependent plasticity, Neural Networks, IEEE Transactions on 17:211-221 (2006).
Jo, et al. Nanoscale Memristor Device as Synapse in Neuromorphic Systems, Nano Letters 10:1297-1301 (2010).
Kong, et al. Spatially-correlated neuron transistors with ion-gel gating for brain-inspired applications. Organic Electronics 44:25-31 (2017).
Krems, et al., Ionic memcapacitive effects in nanopores, Nano Lett 10:2674-2678 (2010).
Lim, et al. Relaxation oscillator-realized artificial electronic neurons, their responses, and noise, Nanoscale 8:9629-9640 (2016).
Lim, et al., Short-term memory of TiO2-based electrochemical capacitors: empirical analysis with adoption of a sliding threshold, Nanotechnology 24:384005 (2013) (8 pages).
Magee, Dendritic integration of excitatory synaptic input, Nat Rev Neurosci 1:181-190 (2000).
Mahowald and Douglas, A silicon neuron, Nature 354:515-518 (1991).
Martinez-Rincon, et al., Solid-state memcapacitive system with negative and diverging capacitance, Physical Review B 81:195430 (2010).
Mehonic and Kenyon, Emulating the Electrical Activity of the Neuron Using a Silicon Oxide RRAM Cell. Front Neurosci 10(57) (2016) (11 pages).
Merolla, et al. A million spiking-neuron integrated circuit with a scalable communication network and interface, Science 345:668-673 (2014).
Nawrocki, et al., A Mini Review of Neuromorphic Architectures and Implementations, IEEE Transactions on Electron Devices 63:3819-3829 (2016).
Ohno, et al. Short-term plasticity and long-term potentiation mimicked in single inorganic synapses, Nature materials 10:591-595 (2011).
Pershin and Di Ventra, Experimental demonstration of associative memory with memristive neural networks. Neural Netw 23:881-886, (2010).
Pickett, et al., A scalable neuristor built with Mott memristors, Nat Mater 12: 114-117 (2013).
Schemmel, et al., Wafer-Scale Integration of Analog Neural Networks, in 2008 IEEE International Joint Conference on Neural Networks (IEEE World Congress on Computational Intelligence) pp. 431-438.
Shibata and Ohmi, A functional MOS transistor featuring gate-level weighted sum and threshold operations, IEEE Transactions on Electron Devices 39:1444-1455 (1992).
Silver, et al. Mastering the game of Go with deep neural networks and tree search, Nature 529:484-489 (2016).
Sourikopoulos, et al. A 4-fJ/Spike Artificial Neuron in 65 nm CMOS Technology. Frontiers in Neuroscience 11(123) (2017) (14 pages).
Stoliar, et al. A Leaky-Integrate-and-Fire Neuron Analog Realized with a Mott Insulator, Advanced Functional Materials 27:1604740 (2017).
Strukov, et al., The missing memristor found, Nature 453:80-83 (2008).
Tran and Teuscher, Memcapacitive Devices in Logic and Crossbar Applications, International Journal of Unconventional Computing 13 (2017) (25 pages).
Tuma, et al., Stochastic phase-change neurons, Nature Nanotechnology 11:693-699 (2016).
Van de Burgt, et al. A non-volatile organic electrochemical device as a low-voltage artificial synapse for neuromorphic computing, Nat Mater 16:414-418 (2017).
Waldrop, The chips are down for Moore's law. Nature 530, 144-147, (2016).
Wan, et al. Proton-Conducting Graphene Oxide-Coupled Neuron Transistors for Brain-Inspired Cognitive Systems. Adv Mater. 28(18):3557-63 (2016).
Wang, et al. Memristors with diffusive dynamics as synaptic emulators for neuromorphic computing. Nat Mater. 16(1):101-108 (2017).
Wang, et al. Synaptic Learning and Memory Functions Achieved Using Oxygen Ion Migration/Diffusion in an Amorphous InGaZnO Memristor. Adv Funct Mater 22(13):2759-2765 (2012).
Wijekoon and Dudek, Compact silicon neuron circuit with spiking and bursting behaviour. Neural Netw. 21(2-3):524-34 (2008).
Wu, et al. Mimicking Classical Conditioning Based on a Single Flexible Memristor. Adv Mater 29, (2017) (10 pages).
Yang, et al. Observation of conducting filament growth in nanoscale resistive memories. Nature Communications 3:732 (2012) (8 pages).
Ziegler, et al. An Electronic Version of Pavlov's Dog. Advanced Functional Materials 22(13):2744-2749, (2012).

* cited by examiner

CAPACITATIVE ARTIFICIAL NEURAL NETWORKS

CROSS-REFERENCE TO RELATED APPLICATIONS

This application claims the benefit of U.S. Provisional Patent Application No. 62/650,497, filed on Mar. 30, 2018, which is incorporated herein by reference in its entirety.

GOVERNMENT FUNDING

This invention was made with government support under Grant No. FA8750-15-2-0044 awarded by the U.S. Air Force Research Laboratory (AFRL). The government has certain rights in the invention.

TECHNICAL FIELD

This disclosure describes apparatus, systems and methods to implement capacitive artificial neural networks.

BACKGROUND

Conventional computers (e.g., von Neuman computers) are built according to the universal computing concept of Alan Turing, using serial instructions, featuring macro-level separation of the memory and the processing. As Moore's law is approaching a limit, Complementary metal-oxide-semiconductor (CMOS)-based Boolean logic, which can consume megawatts of power and take hours to carry out complex, nonlinear, and non-sequential calculations, is not as efficient as real time biological neural information processing systems, which consume in the order of tens of watts of power.

A new computing paradigm using artificial neural networks is being developed based on the computing archetype of the brains, to resolve various disadvantages associated with conventional von Neuman computing, which include, e.g., power inefficiency, serial executions, and synchronous and programming intensive issues. In this new computing paradigm, a complete harness of biologically inspired concepts like activation thresholds and weighted connections relies on hardware implementation of spiking neurons and their dynamically involving synapses. Such hardware approaches promise inherent low power and ultra-large-scale integration, which is challenging to achieve in software simulation on conventional computers.

SUMMARY

This disclosure describes a volatile pseudo-memcapacitor device that is built by combining a diffusive memristor with an external series capacitor, to model a stochastic leaky integrate-and-fire capacitive neuron. The voltage across such a volatile memcapacitor neuron emulates the membrane potential of a biological neuron. Using gate field effect, the electric current across the cell membrane associated with action potential of a biological neuron is replicated by the drain to source current of a transistor in the volatile memcapacitor device, leading to sustainable signal propagation in a two-stage artificial neural network. Concurrent dendritic spatial and temporal summation is realized with capacitive synaptic circuits. A Hebbian-like mechanism is realized in a fully capacitive neural network with non-volatile memcapacitors, and is used to perform associative learning and pattern classification. A device comprised of a 2×1 neural network is described, which can lead to a seamless integration of memcapacitor synapses and neurons towards a large-scale bio-plausible capacitively coupled neural network.

According to one innovative aspect of the subject matter described in this application, an apparatus includes a diffusive memristor, and a capacitor integrated in series with the diffusive memristor, wherein the apparatus exhibits volatile memcapacitive behavior.

The apparatus can optionally include one or more of the following optional features. The diffusive memristor can be placed on top of the capacitor. The diffusive memristor can include a bottom electrode, a top electrode, a metal-doped dielectric layer between the bottom electrode and the top electrode, and one or more layers of the metal sandwiched between the dielectric layer and at least one of the bottom electrode or the top electrode. The bottom electrode can include one of platinum (Pt), titanium nitride (TiN), tantalum nitride (TaN), palladium (Pd), or tungsten (W). The dielectric layer can include one of a silicon oxide ($SiO_x$), hafnium oxide ($HfO_x$), magnesium oxide ($MgO_x$), aluminum oxide ($AlO_x$), silicon oxynitride ($SiN_xO_y$), or tantalum oxide ($TaO_x$). The metal can include one of silver (Ag), copper (Cu), lithium (Li), sodium (Na), or potassium (K). The top electrode can include one of platinum (Pt), titanium nitride (TiN), tantalum nitride (TaN), palladium (Pd), or tungsten (W).

The capacitor can include a bottom plate, a top plate, a first dielectric layer and a second dielectric layer. The bottom plate can include one of platinum (Pt), titanium nitride (TiN), tantalum nitride (TaN), palladium (Pd), tungsten (W), or aluminum (Al). The first dielectric layer can include one of tantalum pentoxide (Ta2O5), hafnium oxide ($HfO_x$), or titanium oxide ($TiO_x$). The second dielectric layer can include one of a tantalum oxide ($TaO_x$), hafnium oxide ($HfO_x$), or titanium oxide ($TiO_x$). The top plate can include one of platinum (Pt), titanium nitride (TiN), tantalum nitride (TaN), palladium (Pd), tungsten (W), or aluminum (Al).

The apparatus can be configured to control a gate potential of a metal-oxide-semiconductor field-effect transistor (MOSFET).

According to another innovative aspect of the subject matter described in this application, a device includes a transistor, and a memcapacitor integrated onto the gate of the transistor, wherein the memcapacitor exhibits volatile memcapacitive behavior. The memcapacitor includes a diffusive memristor, and a capacitor integrated in series with the diffusive memristor, wherein the gate dielectric of the transistor is replaced with the memcapacitor.

The device can optionally include one or more of the following optional features. The transistor device can include a MOSFET. The diffusive memristor can be placed on top of the capacitor.

The diffusive memristor can include a bottom electrode, a top electrode, a metal-doped dielectric layer between the bottom electrode and the top electrode, and one or more layers of the metal sandwiched between the dielectric layer and at least one of the bottom electrode or the top electrode. The bottom electrode can include one of platinum (Pt), titanium nitride (TiN), tantalum nitride (TaN), palladium (Pd), or tungsten (W). The dielectric layer can include one of a silicon oxide ($SiO_x$), hafnium oxide ($HfO_x$), magnesium oxide ($MgO_x$), aluminum oxide ($AlO_x$), silicon oxynitride ($SiN_xO_y$), or tantalum oxide ($TaO_x$). The metal can include one of silver (Ag), copper (Cu), lithium (Li), sodium (Na), or potassium (K). The top electrode can include one of platinum (Pt), titanium nitride (TiN), tantalum nitride (TaN), palladium (Pd), or tungsten (W).

The capacitor can include a bottom plate, a top plate, a first dielectric layer and a second dielectric layer. The bottom plate can include one of platinum (Pt), titanium nitride (TiN), tantalum nitride (TaN), palladium (Pd), tungsten (W), or aluminum (Al). The first dielectric layer can include one of tantalum pentoxide (Ta2O5), hafnium oxide (HfO$_x$), or titanium oxide (TiO$_x$). The second dielectric layer can include one of a tantalum oxide (TaO$_x$), hafnium oxide (HfO$_x$), or titanium oxide (TiO$_x$). The top plate can include one of platinum (Pt), titanium nitride (TiN), tantalum nitride (TaN), palladium (Pd), tungsten (W), or aluminum (Al).

According to another innovative aspect of the subject matter described in this application, an artificial neuron device includes a transistor, a volatile memcapacitor that is configured to operate as an electrically floating gate of the transistor, and one or more synaptic circuits that are coupled to the volatile memcapacitor. The volatile memcapacitor includes a diffusive memristor, and a capacitor integrated in series with the diffusive memristor.

The device can optionally include one or more of the following optional features. Each synaptic circuit can includes at least one of a fixed-value capacitor or a reconfigurable capacitor. The fixed-value capacitor can have a fixed capacitance value. The reconfigurable capacitor can have an electrically programmable capacitance value. The transistor can include a MOSFET. The diffusive memristor can includes a Pt/Ag/SiO$_x$:Ag/Ag/Pt diffusive memristor. The capacitor can include a Pt/Ta$_2$O$_5$/TaO$_x$/Pt capacitor.

According to another innovative aspect of the subject matter described in this application, a system includes a first artificial neuron device and a second artificial neuron device. Each artificial neuron device includes a transistor, a volatile memcapacitor that is configured to operate as an electrically floating gate of the transistor, and one or more synaptic circuits that are coupled to the volatile memcapacitor, wherein a synaptic circuit includes at least one of a fixed-value capacitor or a reconfigurable capacitor. The volatile memcapacitor includes a diffusive memristor, and a capacitor integrated in series with the diffusive memristor. A gate voltage of the first artificial neuron device is controlled by a first presynaptic signal, and a gate voltage of the second artificial neuron device is a weighted sum of a drain voltage of the first artificial neuron device and a second presynaptic signal.

The device can optionally include one or more of the following optional features. The transistor included in the first artificial neuron device can be one of an n-MOSFET or a p-MOSFET, and the transistor included in the second artificial neuron device can be one of a p-MOSFET or an n-MOSFET. Each synaptic circuit can include at least one of a fixed-value capacitor or a reconfigurable capacitor. The fixed-value capacitor can have a fixed capacitance value. The reconfigurable capacitor can have an electrically programmable capacitance value. The fixed-weight of a synaptic circuit can correspond to a fixed capacitance value of the corresponding capacitor. The diffusive memristor can include a Pt/Ag/SiO$_x$:Ag/Ag/Pt diffusive memristor, and the capacitor can include a Pt/Ta$_2$O$_5$/TaO$_x$/Pt capacitor.

The details of one or more implementations of the subject matter described in this specification are set forth in the accompanying drawings and the description below. Other features, aspects, and advantages of the subject matter will become apparent from the description, the drawings, and the claims.

DETAILED DESCRIPTION

Figures 1A, 1B, 1C, 1D, 1E, 1F:
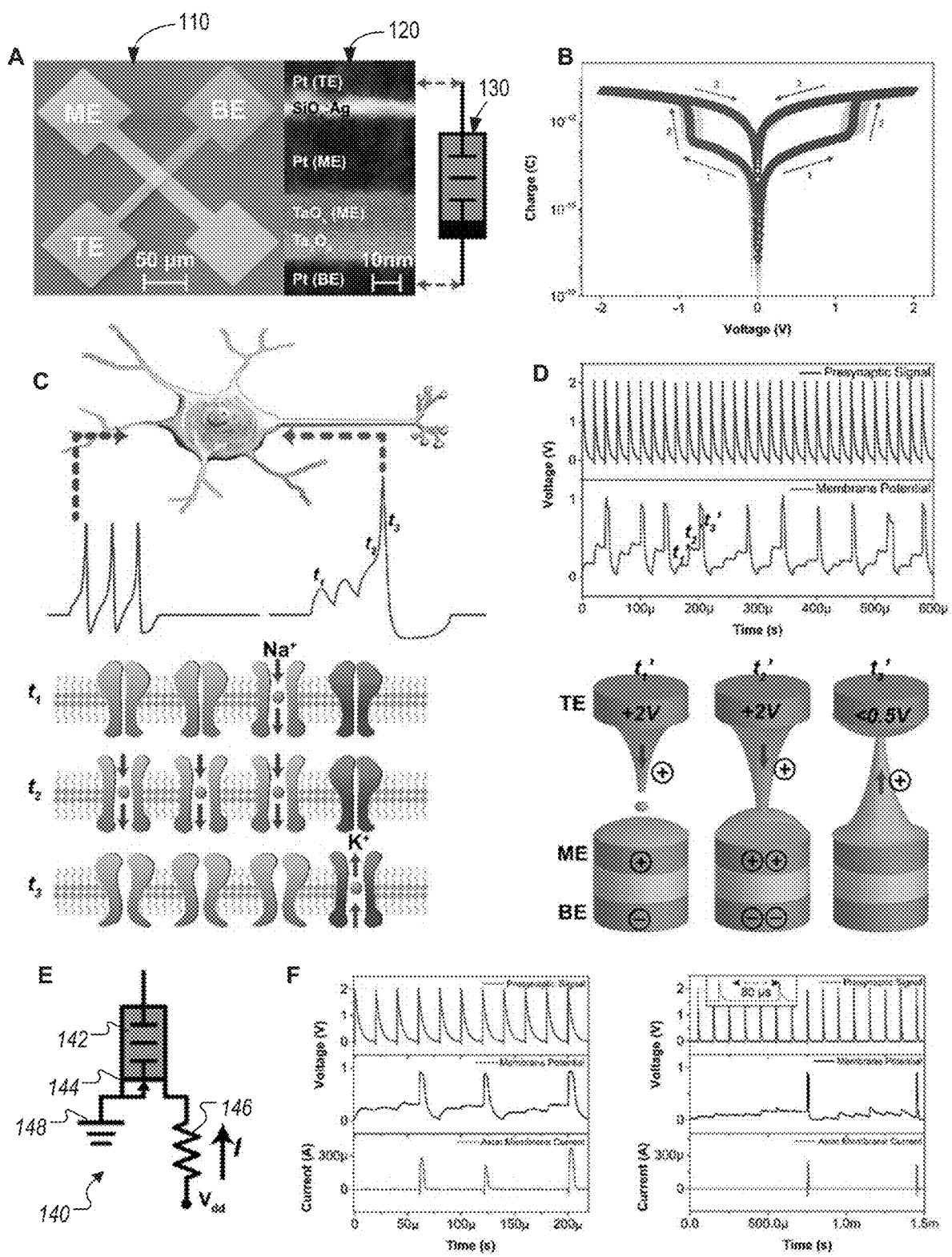
FIGS. 1A-1F illustrate an example of a volatile memcapacitor device and corresponding electrical characteristics that emulate the leaky integrate-and-fire of a biological neuron.

CMOS-based logic circuits, including current-mode, voltage-mode and sub-threshold transistor circuits, are utilized in implementing spiking neuron dynamics captured in models such as the Hodgkin-Huxley model. Such circuits, however, are complex and have large sizes, which hinder seamless integration with highly dense synaptic arrays. Emerging devices such as memristors are being developed to realize functionalities of neurons. For example, memristors, by projecting their conductance to the action potential of neurons, have shown the integration and fire capability that is characteristic of neurons. Together with a broad spectrum of memristor artificial synapses, neuron networks can be built in a fully resistive coupling fashion.

Resistively coupled synapses and neurons, however, suffer from non-zero current flow in equilibrium state, and lack the ability to maintain sustainable signal propagation in a multi-layer neural network. These limitations of a resistive network can be resolved in a capacitively coupled neural network, which spatially sum up the voltage deflections of capacitive synapses and convert the potential across the neuron capacitor to axon current by using the gate field effect over a conventional semiconductor channel, e.g., a silicon (Si) channel. Such a neural network features extremely low static power dissipation due to inherent capacitive spatial weight summation and active neuron operation, leading to sustainable signal propagation in deep neural networks. The missing enabler of such a network is a capacitive element with leaky integration and fire capability, which is referred to as a volatile memcapacitor.

On the other hand, dynamics of nanoscale Ag cluster in dielectrics has been used to emulate the dynamics of ion channels. As described in this disclosure, a volatile memcapacitor device is built by combining a diffusive memristor with an external series capacitor, to model a stochastic leaky integrate-and-fire memcapacitor neuron. In this context, the volatile behavior of the memcapacitor corresponds to a leaky integration and fire capability, which is realized by the device switching to a low resistance state under a voltage pulse after a random delay time, and relaxing back to a high resistance state spontaneously upon removal of the applied electrical bias. The leads to an intrinsic stochasticity of the delay time. The volatile memcapacitive behavior is further described below respect to FIG. 1B.

The voltage across such a volatile memcapacitor neuron emulates the membrane potential of its biological counterpart due to the resemblance between nanoscale silver (Ag) and sodium ion ($Na^+$) dynamics. Using gate field effect, the electric current across the cell membrane associated with action potential of a biological neuron is replicated by the drain to source current of a transistor in the volatile memcapacitor device, leading to sustainable signal propagation in a two-stage network. Concurrent dendritic spatial and temporal summation is realized with capacitive synapses. Additionally, a Hebbian-like mechanism is realized in a fully capacitive neural network with non-volatile memcapacitors, and is used to perform associative learning and demonstrate pattern classification. A single entity comprised of a 2×1 network is fabricated, which can lead to a seamless integration of memcapacitor synapses and neurons towards large-scale bio-plausible capacitively coupled neural network.

Memcapacitor Device

FIGS. 1A-1F illustrate an example of a volatile memcapacitor device and corresponding electrical characteristics that emulate the leaky integrate-and-fire of a biological neuron. The memcapacitor is a member of the class of memory-circuit elements, having a capacitance value that is determined by past input, similar to the history-dependent resistance in a memristor.

FIG. 1A shows a scanning electron micrographic top view 110 of an integrated memcapacitor 130 and transmission electron micrographic cross-section 120 prepared by focused ion beam cutting. In some implementations, the memcapacitor device 130 is built by a circuit that includes a diffusive memristor and an integrated capacitor in series, which shows memcapacitive behavior with a volatile nature. The memcapacitive effects are associated with memristive effect.

In some implementations, the diffusive memristor devices includes a dielectric insulating switching layer that is doped with a fast diffusive and electrochemically active metal and sandwiched between a metal bottom electrode and a metal top electrode. For example, as shown in FIG. 1A, in some implementations, the dielectric insulating switching layer includes a silicon oxide ($SiO_x$) layer, the fast diffusive and electrochemically active metal is silver (Ag), and the top and bottom electrodes are platinum (Pt) electrodes. In some implementations, an additional layer of the metal is juxtaposed between the switching layer and the top electrode, or between the switching layer and the top electrode, or both. For example, in some implementations, the diffusive memristor example described above includes an additional layer of Ag between the $SiO_x$:Ag switching layer and the Pt top electrode, and/or an additional layer of Ag between the $SiO_x$:Ag switching layer and the Pt bottom electrode.

In some implementations, the top electrode or the bottom electrode, or both, include a different metallic electrode material, such as titanium nitride (TiN), tantalum nitride (TaN), palladium (Pd), or tungsten (W). In some implementations, a different fast diffusive and electrochemically active metal is used, such as copper (Cu), lithium (Li), sodium (Na), or potassium (K). In some implementations, a different dielectric material is used, such as hafnium oxide ($HfO_x$), magnesium oxide ($MgO_x$), aluminum oxide ($AlO_x$), silicon oxynitride ($SiN_xO_y$), or tantalum oxide ($TaO_x$).

As shown in FIG. 1A, in some implementations, the diffusive memristor sits on top of a $Pt/Ta_2O_5/TaO_x/Pt$ capacitor (where Ta: tantalum and $Ta_yO_x$: a type of tantalum oxide). $Ta_2O_5$ is a high-κ dielectric, and therefore the capacitance of the series capacitor is much larger than the intrinsic capacitance of the diffusive memristor, which yields binary capacitance switching of the memcapacitor circuit.

In some implementations, the capacitor includes different materials. For example, in some implementations, the bottom plate of the capacitor includes one of platinum (Pt), titanium nitride (TiN), tantalum nitride (TaN), palladium (Pd), tungsten (W), or aluminum (Al). In some implementations, a first dielectric layer of the capacitor includes one of tantalum pentoxide ($Ta_2O_5$), hafnium oxide ($HfO_x$), or titanium oxide ($TiO_x$). In some implementations, a second dielectric layer of the capacitor includes one of a tantalum oxide ($TaO_x$), hafnium oxide ($HfO_x$), or titanium oxide ($TiO_x$). In some implementations, the top plate of the capacitor includes one of platinum (Pt), titanium nitride (TiN), tantalum nitride (TaN), palladium (Pd), tungsten (W), or aluminum (Al).

FIG. 1B illustrates charge-voltage relationship of the integrated memcapacitor 130 shown in FIG. 1A. The hysteresis loops reveal the volatile memcapacitive switching. As shown, the arrows 1, 2 and 3 label low capacitance states, capacitance transitions, and high capacitance states, respectively. The volatile memcapacitor exhibits hysteresis loops of charge versus voltage at both biasing polarities with the application of external voltages above certain thresholds. The electric field switches the diffusive memristor to its low resistance state (e.g., "ON" state), thus shorting its intrinsic capacitor. As a result, the overall capacitance, originally dominated by the intrinsic capacitance of the diffusive memristor, suddenly reaches the capacitance of the integrated series capacitor.

Figures 2A, 2B, 2C, 2D, 2E, 2F, 2G, 2H, 2I, 2J:
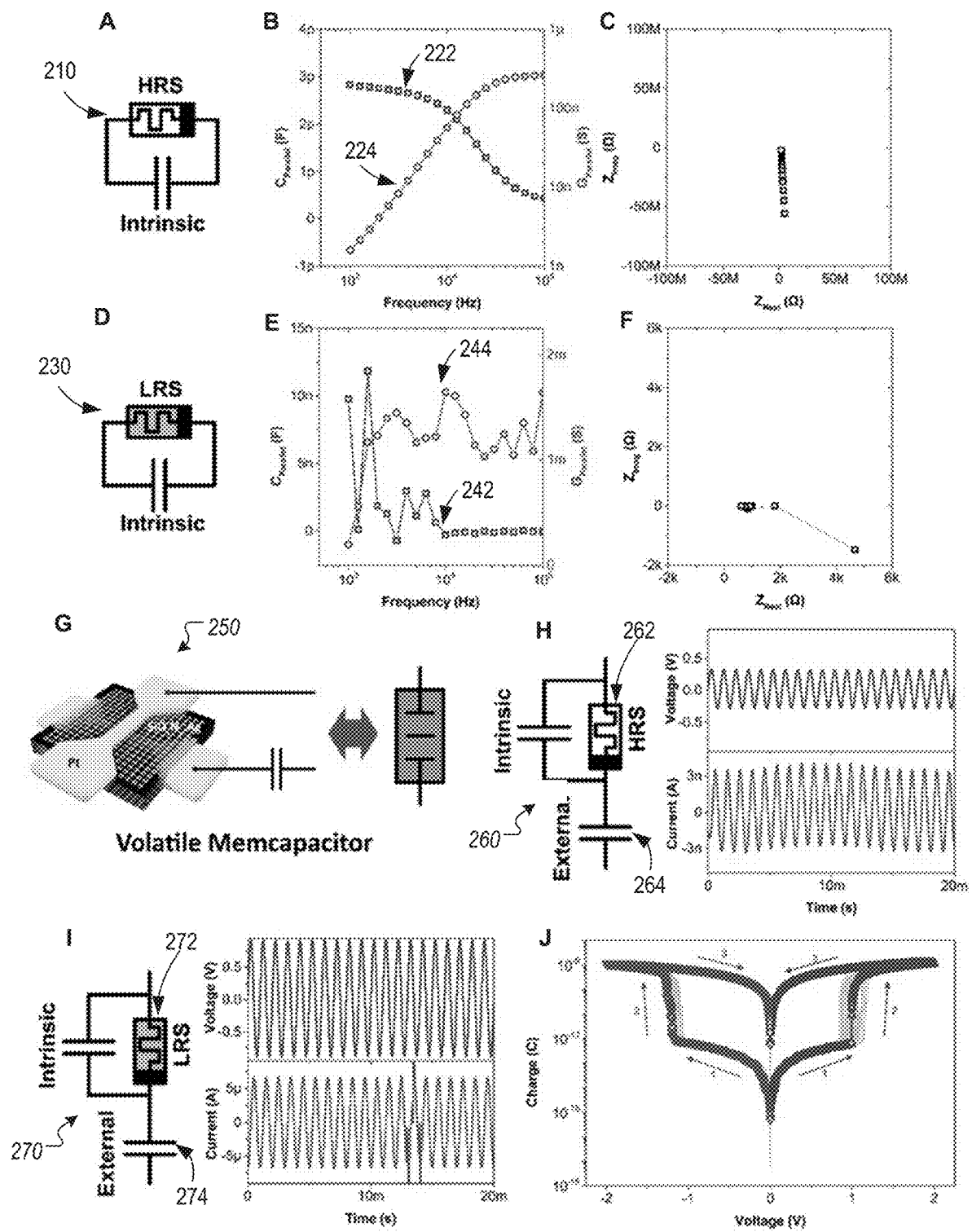
FIGS. 2A-2J illustrate examples of impedance characteristics of diffusive memristors and switchable capacitance property of memcapacitors, providing a detailed characterization of impedance in different states for the volatile memcapacitor.

FIGS. 2A-2J illustrate examples of impedance characteristics of diffusive memristors and switchable capacitance property of memcapacitors, providing a detailed characterization of impedance in different states for the volatile memcapacitor. The physical origin of the aforementioned threshold switching can be interpreted by the underlying electrochemical reactions and ion migration processes, where one or more conductive filaments play a critical role. FIG. 2A shows a schematic of the equivalent circuit of a diffusive memristor 210 at its high resistance state (HRS), which takes into account its intrinsic capacitance. In some implementations, the diffusive memristor 210 is an example of the diffusive memristor of the volatile memcapacitor circuit 130. FIG. 2B illustrates a capacitance ($C_{parallel}$) to frequency relationship (curve 222) and conductance ($G_{parallel}$) to frequency relationship (curve 224) ranging from 1 kHz to 100 kHz. FIG. 2C illustrates an imaginary part ($Z_{imag}$) versus real part ($Z_{real}$) of the impedance, indicating the capacitive circuit response. FIG. 2D provides a schematic of the equivalent circuit of a diffusive memristor 230 at its low resistance state. In some implementations, the diffusive memristor 210 is an example of the diffusive memristor of the volatile memcapacitor circuit 130.

FIG. 2E shows capacitance ($C_{parallel}$) to frequency relationship (curve 242) and conductance ($G_{parallel}$) to frequency relationship (curve 244) ranging from 1 kHz to 100 kHz. FIG. 2F shows an imaginary part ($Z_{imag}$) of the impedance versus real part ($Z_{real}$) of the impedance, indicating the resistive circuit response at its low resistance state. FIG. 2G provides a schematic of a volatile memcapacitor circuit 250 that includes a diffusive memristor in series with an external capacitor. In some implementations, the external capacitor has a capacitance value of one nanofarad (nF). In some implementations, the volatile memcapacitor circuit 250 is an example of the volatile memcapacitor circuit 130.

FIG. 2H shows the temporal current-voltage response of the low capacitance state of a volatile memcapacitor 260, which includes a HRS diffusive memristor 262 in series with an external capacitor 264. In some implementations, the volatile memcapacitor 260 is an example of the volatile memcapacitor circuit 250. The amplitude of the sinusoidal current observed is approximately 3 nano-amperes (nA) with around 90 degrees phase difference from the input voltage waveforms, indicating approximately 2.5 pico-farad (pF) capacitance consistent with the observation in FIG. 2B.

FIG. 2I shows the temporal current-voltage response of the high capacitance state of a volatile memcapacitor 270, which includes a LRS diffusive memristor 272 in series with an external capacitor 274. In some implementations, the volatile memcapacitor 270 is an example of the volatile memcapacitor circuit 250. In the illustrated example, a larger amplitude of 0.9V is adopted to keep the memcapacitor device in the ON state. The amplitude of the current is approximately 5 microamperes (µA) with around 90 degrees phase difference from the input voltage waveforms, indicating approximately 1 nF capacitance consistent with the external capacitor. FIG. 2J shows an example graph of a charge-voltage relationship of a diffusive memristor in series with a 1 nF capacitor, showing volatile memcapacitive switching. The arrows 1-3 correspond to low capacitance states, capacitance transitions, and high capacitance states, respectively.

Temporal Integration and Fire of Memcapacitor Device

FIG. 1C provides a schematic representation of a biological neuron generating an action potential after receiving high frequency postsynaptic inputs. As shown, at time $t_1$, the membrane potential does not reach the threshold, so few sodium channels are open upon the arrival of the signal. As the neuron keeps on receiving input stimulus, the membrane potential hits the threshold at time $t_2$, inducing quick opening of all available sodium ion channels. The potential reaches its maxima at time $t_3$, and starts to decrease due to the repolarization caused by the opening of potassium ion channel and inactivation of sodium ion channels.

Emulating biophysics of neuronal systems by electronic devices is of great technical significance towards hardware neural network. Instead of duplicating the entire biological neuronal network rigidly, a more plausible method is to seek out the key features of neurons. Temporal summation is one of the fundamental functions performed by a single neuron, as described by the Hodgkin-Huxley model. The summation of signal in time is associated with the switching of the voltage gated sodium ion channels assisted by other channels and pumps, which integrates the postsynaptic potentials and produces the subsequent action potential. In a typical temporal summation process, high frequency presynaptic spikes propagate to the soma, which leads to the swift opening and shutting of a small portion of the sodium ionic channels and the gradual stepping up of the membrane potential. Once the membrane potential exceeds the threshold, the fast inward-flow of sodium ions results in significant further rise of the membrane potential. This positive feedback rises the potential explosively until all available sodium ion channels are open, leading to the observed large upswing in the membrane potential, as shown in FIG. 1C and discussed above. Once the maximum is reached, the membrane experiences repolarization due to the inactivation of the sodium ion channels and the opening of the potassium ion channels.

By virtue of the biomimetic Ag dynamics, the membrane potential to an input pulse train can be replicated in the volatile memcapacitor. FIG. 1D illustrates the integrate-and-fire process of a volatile memcapacitor that shares a strong resemblance with the biological neuron of FIG. 1C. As shown in FIG. 1D, at time $t_1'$, the potential across the capacitor rises upon the input stimulus due to swift formation and rupture of weak Ag filaments from the upper electrode. As the membrane potential meets the threshold at time $t_2'$, the accumulation of charge would drive Ag growth on the lower electrode, which narrows the effect dielectric gap and enhances the conductivity of the upper filaments. The formation of the filament at time $t_3'$ is driven by the Ag migration from the lower electrode under the large membrane potential, which quickly discharges the capacitor and brings the membrane potential back to its resting value, mimicking the repolarization effect.

Figures 4A, 4B, 4C, 4D:
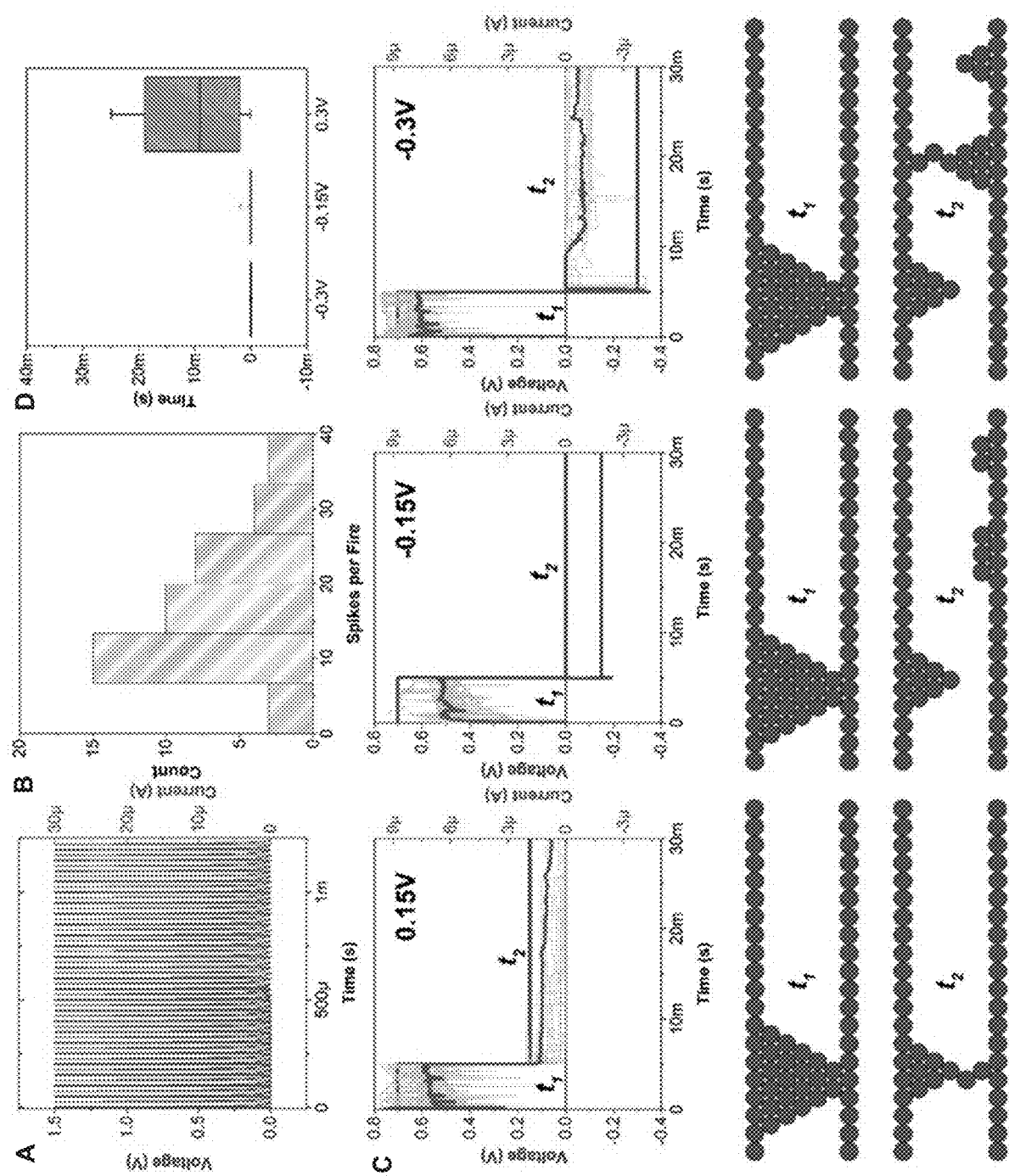
FIGS. 4A-4D illustrate an example of the integration and fire in a diffusive memristor and self-inactivation mechanism, thereby demonstrating voltage polarity effects on OFF switching speed.

FIG. 1D shows that the memcapacitor accumulates charge without "firing" due to the swift formation and rupture of weak Ag filament from the upper electrode of the diffusive memristor with small membrane potential. FIGS. 4A-4D illustrate an example of the integration and fire in a diffusive memristor and self-inactivation mechanism, thereby demonstrating voltage polarity effects on OFF switching speed. FIG. 4A illustrates the current response of a 1.5V voltage pulse train showing integrate-and-fire behavior. FIG. 4B shows a histogram of stochastic characteristic of a diffusive memristor. The number of spikes needed to trigger a firing event follows normal distribution. FIG. 4C illustrates single pulse response of a diffusive memristor. Voltage and current are depicted by blue and red curves, respectively, where one typical current curve is highlighted in red. Times $t_1$ and $t_2$ are framed within the first and second phases of biasing, respectively. The upper left panel of FIG. 4C shows that a 0.15V post-spike bias leads to a long-term spontaneous relaxation after the device has been switched on, while a small negative bias (−0.15V) facilitated fast relaxation in the upper middle panel of FIG. 4C. In the upper right panel of FIG. 4C, a larger negative bias (−0.3V) made the device relax fast at first, but followed by another ON-switching after approximately 10 ms. The underlying mechanism is illustrated in the lower panels where Ag nano-particles are represented in red circles. Considering that the device has been switched ON by a positive voltage at the top electrode, Ag ions are driven across the dielectric film until a stable filament has been formed. In the case when a small positive voltage bias is applied during relaxation, the device can hardly return to its high resistance state because the small voltage keeps pushing Ag ions towards bottom electrode, as shown in the left-bottom panel of FIG. 4C. If a small negative bias is used, as shown in the mid-bottom panel of FIG. 4C, the voltage enhanced the rupture of metallic filament, leading to fast relaxation. However, if the negative bias is sufficiently large, which correspond to the right panel at the bottom of FIG. 4C, the original filament ruptures but a new filament can be formed and switch ON the device again.

The voltage between the diffusive memristor and the capacitance rises upon each input stimulus, similar to that shown in FIG. 1C. With a sufficient number of stimuli, the rising of the potential eventually produces a significant large spike, e.g., due to the increasing charge of the capacitor-induced formation of Ag protrusion on the counter electrode, which effectively narrows the dielectric gap. The large membrane potential triggers Ag migration from the lower electrode to the upper electrode once the presynaptic input has faded, which quickly discharges the capacitor and returns the membrane potential to its resting value, enabling the neuron for another sequence of integration and fire. The volatility of the filament accordingly equips the neuron with the repolarization and self-inactivation features of ion channels, which differs from non-volatile memristive neurons with RESET pulses.

Active Neuron and Leaky Effect Using Memcapacitor

FIG. 1E illustrates an example memcapacitor neuron circuit 140 that includes a memcapacitor 142 integrated onto the gate of a metal-oxide-semiconductor field-effect transistor (MOSFET) 144. In some implementations, the memcapacitor 142 is an example of the memcapacitor 130. In the example memcapacitor neuron circuit 140, the drain of the MOSFET 144 is connected to a voltage source $V_{dd}$ through a resistor 146, while the source of the MOSFET 144 is connected to ground 148. As shown by the example in FIG. 1E, the volatile memcapacitor temporal integration and fire feature enables building an active neuron by replacing the gate dielectric of a transistor with the volatile memcapacitor neuron, where the gate voltage replicates the membrane potential at the soma and the drain current emulates the electric charge flow across the membrane of axon upon the arrival of an action potential. Such a neuron mimics the behavior of a biological counterpart: e.g., as shown in FIG. 1F, a train of narrowly spaced presynaptic voltage pulses builds up a potential across the neural membrane until the neuron generates a voltage transient at a specified threshold. FIG. 1F illustrates the leaky effect of memcapacitive integration-and-fire. The left panel of FIG. 1F shows a sequence of presynaptic spikes at high frequency (blue lines), the membrane potential of the memcapacitor neuron (black lines), and the axon membrane current (red lines) marked in FIG. 1E. In the right panel of FIG. 1F, same shaped pulses with 80 μs intervals in between are applied, leading to a much slower firing event.

In some implementations, if the interval between input voltage spikes is increased, there is significant discharge of the membrane capacitor of biological neuron between the two spikes, which makes the neuron receive more pulses to produce an action potential. This feature is equipped on the memcapacitor neuron, in which less frequent voltage spikes (e.g., 80 μs (microsecond) pulse separation) yield a slower rate in generating action potential. This leaky feature is a natural consequence of the finite resistance of the diffusive memristor, resembling the permeability of the neuron cell membrane to ions.

Dendritic Spatial Summation

The dendritic tree of each neuron interfaces with adjacent branched axon projections to propagate the electrochemical stimulation from neighboring neurons to its own soma via hundreds to thousands of synapses. The morphology of dendrites varies, leading to different functionalities of neurons. Dendrites play a fundamental role in summing up synaptic inputs and in determining the extent to which the action potential is produced. Their functions include the addition of unitary events occurring simultaneously in different parts of the dendrite arbor (spatial summation) and temporal leaky integration at the soma. The spatial summation of synaptic inputs can be highly nonlinear, which enhances processing capabilities at the single neuron level. The memcapacitor neuron can naturally calculate the spatially weighted sum of all input signals at the gate level, and thereby modulate the corresponding membrane potential and axon output current based on the result of such a weighted sum, in a similar fashion as a biological neuron.

Figures 3A, 3B, 3C, 3D, 3E, 3F, 3G:
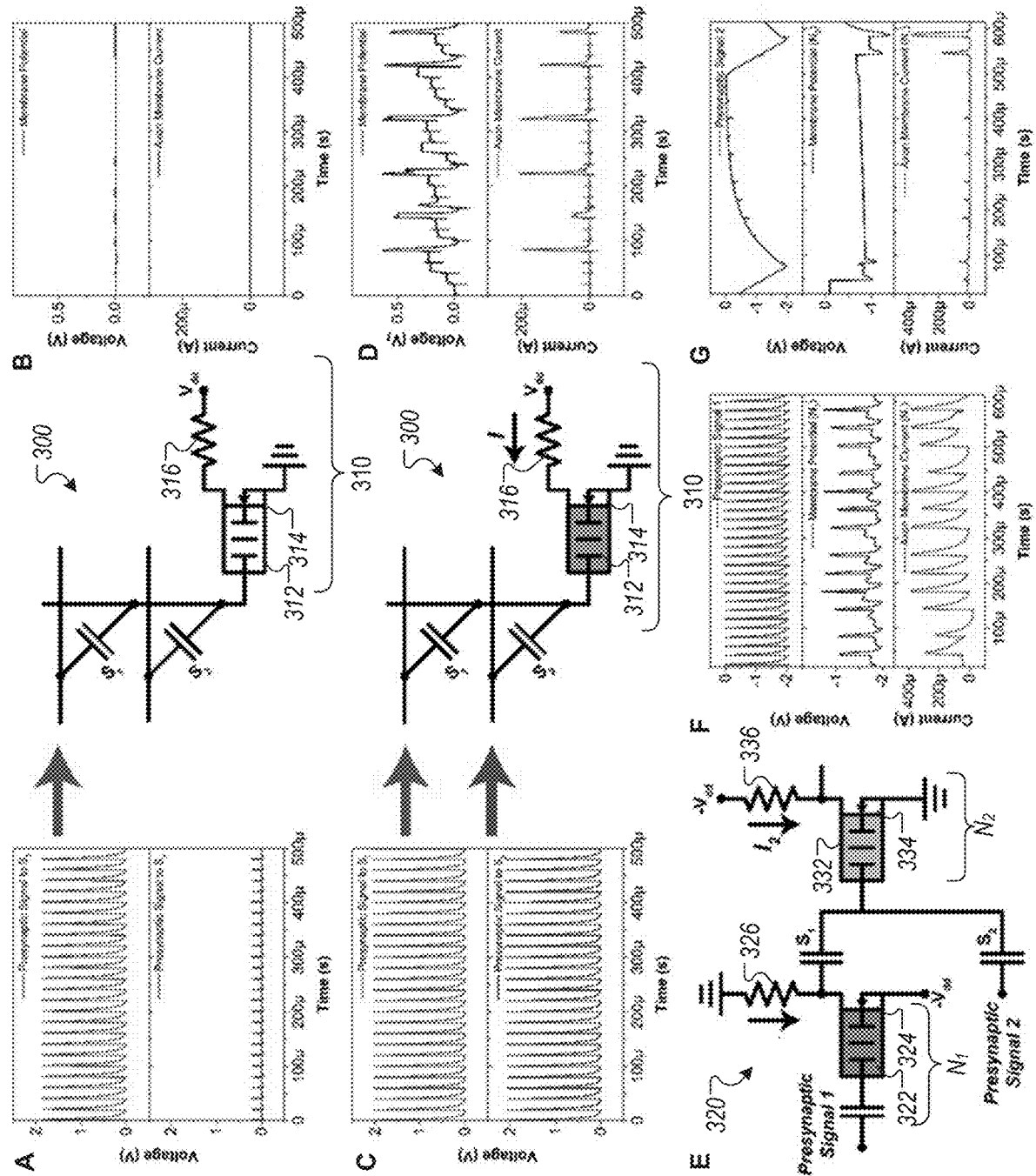
FIGS. 3A-3G illustrate an example of dendritic spatial summation and sustainable signal propagation of memcapacitor neurons.

FIGS. 3A-3G illustrate an example of dendritic spatial summation and sustainable signal propagation of memcapacitor neurons. FIGS. 3A and 3C illustrate presynaptic signals and a circuit 300. The circuit 300 includes a memcapacitor neuron circuit 310 that is coupled to two synapses $S_1$ and $S_2$. The memcapacitor neuron circuit 310 includes a volatile memcapacitor 312 that serves as an electrically floating gate of a neuron transistor 314. The drain of the transistor 314 is coupled voltage source $V_{dd}$ through a resistor 316, while the source of the transistor 314 is coupled to ground. In some implementations, the memcapacitor neuron circuit 310 is an example of the memcapacitor neuron circuit 140. As shown, the two capacitively coupled synapses $S_1$ and $S_2$ are coupled to the memcapacitor 312 in the memcapacitor neuron circuit 310. In some implementations, one or more of the synapses $S_1$ and $S_2$ includes a fixed-value capacitor with a fixed capacitance value. In some implementations, one or more of the synapses $S_1$ and $S_2$ includes a reconfigurable capacitor has an electrically programmable capacitance value.

As shown in FIGS. 3A and 3C, the red and blue curves represent the pre-synaptic voltage spikes to the two synapses $S_1$ and $S_2$, which correspond to presynaptic potentials from neighboring neurons. The triggered postsynaptic membrane potential and axon current are depicted by the black and green curves in FIGS. 3B and 3D, respectively. As shown in FIG. 3A, in case a single synapse is excited, e.g., synapse $S_1$, the resultant voltage stimulation is not capable to build a Ag filament or make the memcapacitor neuron fire. However, as shown in FIG. 3C, concurrent stimulation of both synapses $S_1$ and $S_2$ produces clear temporal integration on the membrane potential in FIG. 3D, leading to the observed spikes in axon current. This spatial summation features super-linearity in membrane potential build-up because the filament building time reduces as voltage across the diffusive memristor increases. Since the voltage signals are added in the form of charge accumulation on capacitors, there is no static power dissipation as compared to the wired sum of currents in resistively coupled neural network.

Propagation

Biological neurons are signal generators as ion pumps convert chemical energy to electrical power, which makes the neurons electrically active. To replicate this function, an artificial neuron should be able to provide energy for neural signal propagation in multi-layer neural networks. In addition, recent neuromorphic designs have emphasized the advantage of passive synapses, relying on active elements such as operational amplifiers (operation amps), to drive synapses' evolution and make inferences from their state. The memcapacitor neuron, e.g., memcapacitor neuron circuit 140 or 310, features a minimal footprint with a single transistor (e.g., transistor 144 or 314) and a memcapacitive gate (e.g., memcapacitor 142 or 312 connected to the gate of the transistor 144 or 314, respectively), among all designs of the active neurons, indicating excellent scalability.

FIG. 3E illustrates an example circuit diagram of a two-stage neural network 320, formed using cascaded memcapacitor neurons $N_1$ and $N_2$, which are coupled using synapses $S_1$ and $S_2$. As shown, the neuron $N_1$ includes a volatile memcapacitor 322 that is coupled to the gate of a transistor 324. The drain of the transistor 324 is coupled to ground through a resistor 326, while the source of transistor 324 is coupled to voltage source $V_{dd}$. In some implementations, the transistor 324 is an n-MOSFET transistor, and the first stage neuron $N_1$ is an n-MOSFET volatile memcapacitor neuron. The neuron $N_2$ includes a volatile memcapacitor 332 that is coupled to the gate of a transistor 334. The drain of the transistor 334 is coupled to voltage source $V_{dd}$ through a resistor 336, while the source of transistor 334 is coupled to ground. In some implementations, the transistor 334 is a p-MOSFET transistor, and the second stage neuron $N_2$ is a p-MOSFET memcapacitor neuron. In some implementations, each of the neurons $N_1$ and $N_2$ are examples of memcapacitor neuron circuit 140. In some implementations, one or more of the synapses $S_1$ and $S_2$ are fixed capacitance synapses with equal weights. In some implementations, one or more of the synapses $S_1$ and $S_2$ has a reconfigurable capacitor with an electrically programmable capacitance value.

In some implementations, during operation of the two-stage neural network 320, the first stage neuron $N_1$ integrates the input presynaptic signal 1 and fires. The presynaptic voltage to the second stage memcapacitor neuron $N_2$ is the weighted sum of the drain voltage of the first stage memcapacitor neuron $N_1$ and presynaptic signal 2. The gate field effect of memcapacitor neurons $N_1$ and $N_2$ make them effective power suppliers in leaky integrate-and-fire, enabling signal propagation in the two-stage neural network 320.

FIGS. 3F and 3G illustrate the external pre-synaptic input, triggered postsynaptic membrane potential, and axon current of the cascaded memcapacitor neurons $N_1$ and $N_2$ of FIG. 3E. The weighted sum of the drain voltage of $N_1$ and the presynaptic signal 2, which leads to the observed integration and fire of the second stage memcapacitor neuron $N_2$, illustrates two important biomimetic properties: neuronal gain and spatial summation. The gain function is formulated over the relationship between the presynaptic stimulation and the neural fire rate, which is the basis of a neuronal tuning function. In one illustrative example, the first stage neuron $N_1$ took 2.3 2-volt (V) spikes per fire on average, as indicated in FIG. 3F. The synergy of the output of the first stage neuron $N_1$ and the input 2 further triggered the next-stage neuron $N_2$ firing, e.g., as revealed by the membrane potential of the second stage neuron $N_2$ in FIG. 3G. The second stage neuron $N_2$ consumed approximately 3 concurrent spikes from both synapses (weighted sum greater than 1.6V) to fire, consistent with the first stage.

Memcapacitive Neural Network—Classical Conditioning

Hebb's Rule is an important cellular mechanism for synapse weight modulation, in which overlapping of pre- and post-synaptic signals enhances the synaptic weight. In some implementations, to realize a Hebbian-like mechanism in a capacitively coupled network, a volatile memcapacitor neuron is paired with non-volatile memcapacitor synapses, built in a similar fashion with the device structure of FIG. 1A. As described in greater detail below, such an implementation realizes non-volatile memcapacitors, which differ from volatile memcapacitors in terms of material systems, which can be switched by external positive or negative voltage spikes like a memristor, as shown, for example, by the description with respect to FIG. 6 below. Since the capacitance weight change is persistent, the realized circuit simulates the long-term plasticity of chemical synapses, such as potentiation and depression. The fire of the post-synaptic memcapacitor neuron comes from the volatile capacitance increment. Due to voltage division effect, the volatile memcapacitor transmits a back-propagating signal to the non-volatile memcapacitor synapse, which can program the memcapacitor to a high capacitance state together with the presynaptic voltage signal. Such back-propagation capability, which usually cost-complicate feedback circuits in conventional CMOS solutions, is implemented in a more straightforward and reliable approach compared to conventional CMOS circuits. Accordingly, as described by the information with respect to FIG. 7 below, the potentiation of memcapacitor synapse temporally correlates forward-propagating signals from the presynaptic neuron with back-propagating signals from the postsynaptic memcapacitor neuron in an unsupervised way, forming the basis of the Hebbian-like mechanism.

Figures 6A, 6B, 6C, 6D:
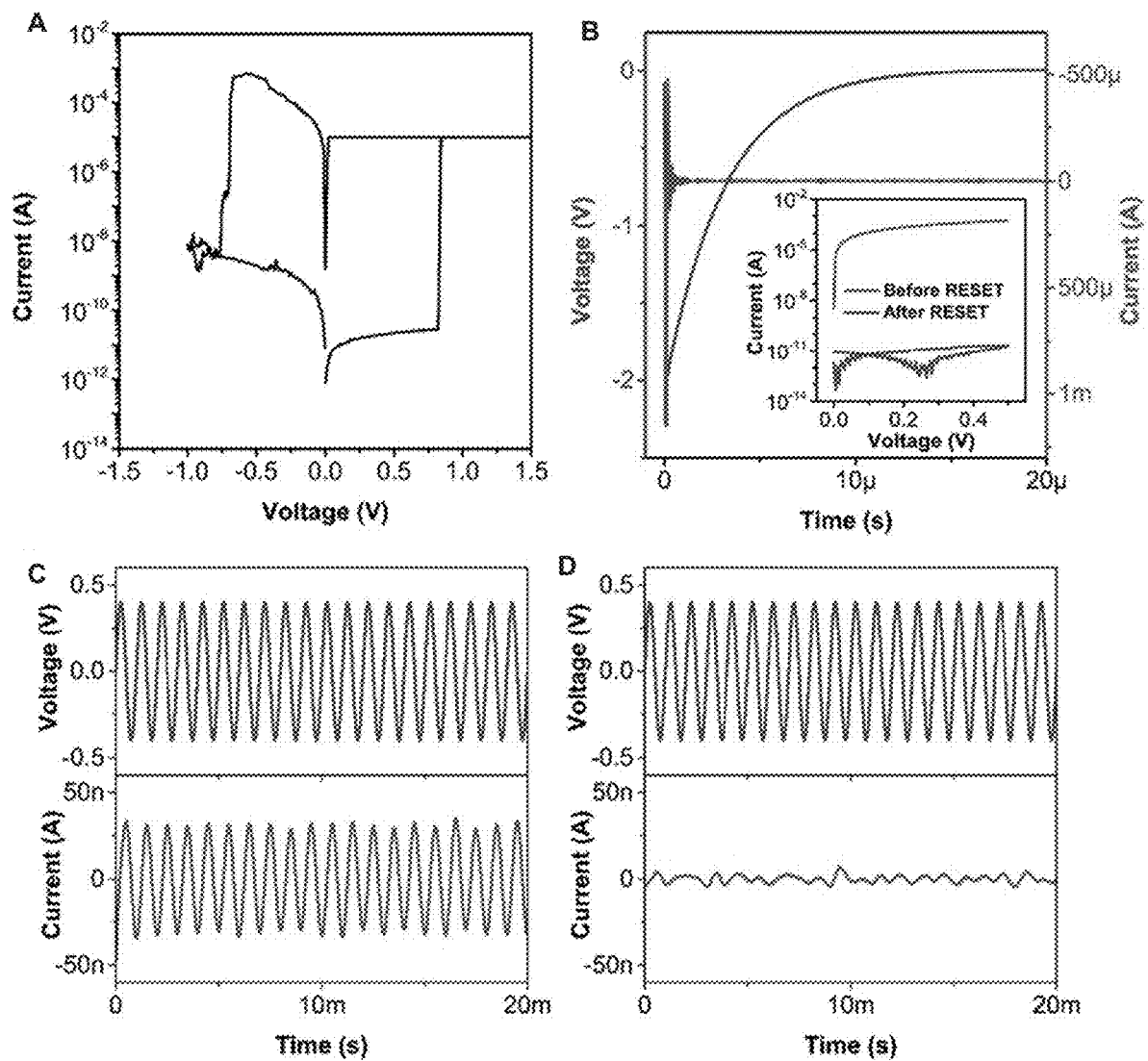
FIGS. 6A-6D illustrate examples of the electrical property of a non-volatile memcapacitor.

FIGS. 6A-6D illustrate examples of the electrical property of a non-volatile memcapacitor. FIG. 6A shows the resistive switching of a non-volatile Ag-based electrochemical metallization cell. FIG. 6B shows the depression (e.g., switching from high capacitance state to low capacitance state) of a memcapacitor synapse by a negative voltage spike. The switching can be verified by the resistance reading of the Ag based electrochemical metallization cell. The potentiation of the non-volatile memcapacitor follows the same manner with that of the volatile memcapacitor. FIGS. 6C and 6D illustrate the temporal current-voltage response of the high and low capacitance state of the integrated non-volatile memcapacitor of FIG. 8, respectively. The amplitude of the sinusoidal current observed is approximately 30 nA and approximately 1 nA, respectively, with around 90 degrees phase difference from the input voltage waveforms, indicating approximately 25 pF and 1 pF capacitor.

Figures 7A, 7B, 7C, 7D, 7E, 7F:
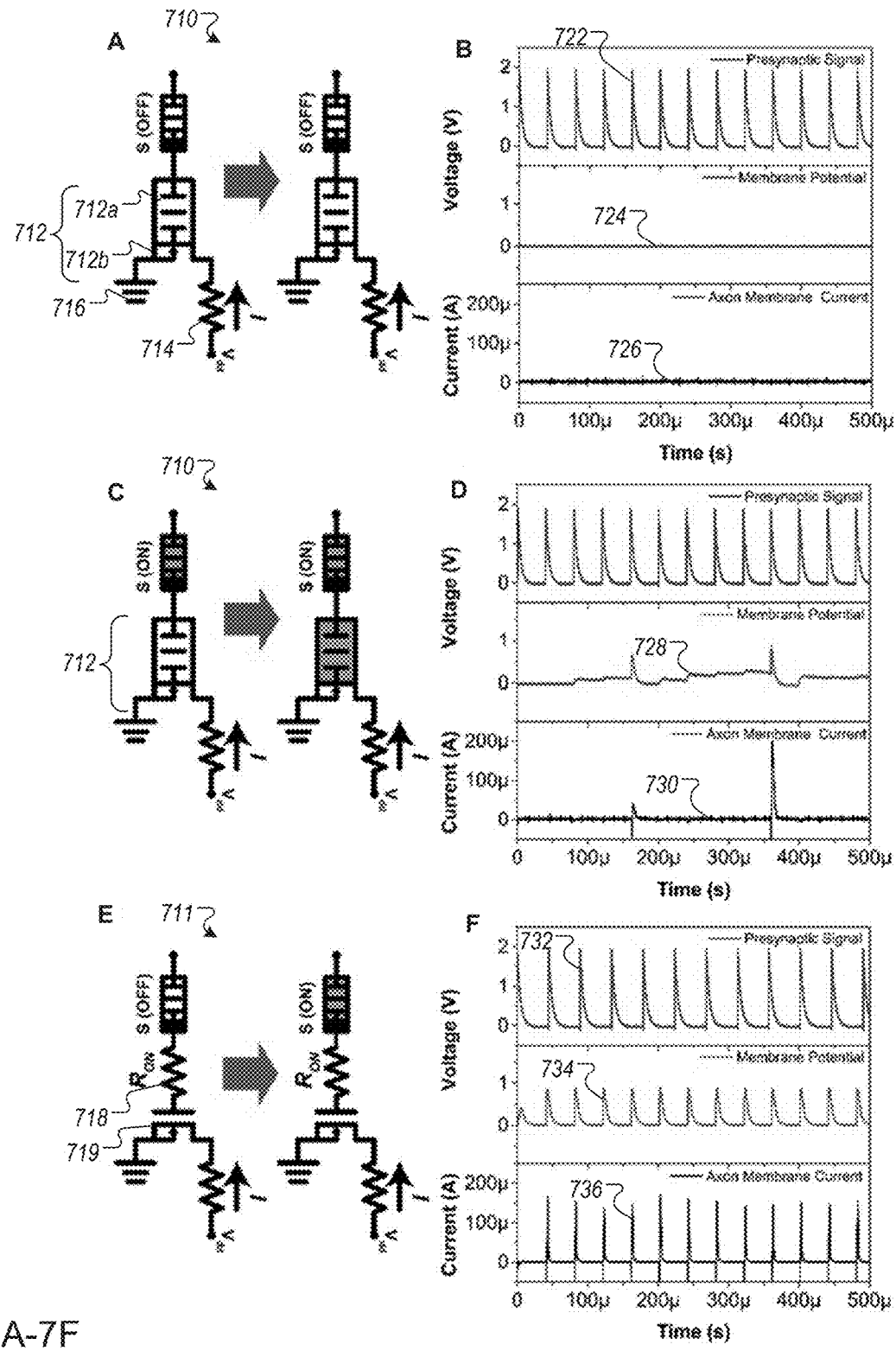
FIGS. 7A-7F illustrate three example cases as the basis for Hebbian learning realization.

FIGS. 7A-7F illustrate three example cases as the basis for Hebbian learning realization. FIG. 7A shows a neuronal network circuit 710 of a one-synapse-one-neuron structure. The circuit 710 includes a memcapacitor neuron 712 coupled to a synapse S. The memcapacitor neuron includes a memcapacitor 712a that is integrated onto the gate of a MOSFET 712b. In the example memcapacitor neuron circuit 140, the drain of the MOSFET 712b is connected to a voltage source $V_{dd}$ through a resistor 714, while the source of the MOSFET 144 is connected to ground 716. In some implementations, the memcapacitor neuron 712 is an example of the memcapacitor neuron circuit 140. In some implementations, the circuit 710 cannot be triggered to fire if the synapse S is of small weight (or OFF state). The drain of the transistor of the memcapacitor neuron 712 is pulled up to source voltage $V_{dd}$ by resistor 714. The input is applied to the synapses by a function generator.

FIG. 7B shows that the spike input (represented by curve 722) does not change the gate voltage (represented by curve 724) or the simulated membrane potential (represented by curve 726), resulting in zero output. FIG. 7C shows a circuit schematic in which the neuron 712 fires if input is applied to a large weighted (or ON-state) synapse S. FIG. 7D shows the input voltage spikes, membrane potential and output current, which are plotted in the same manner as in FIG. 7B. The firing is indicated by a change in the gate voltage (represented by curve 728) or the simulated membrane potential (represented by curve 730).

FIG. 7E shows a modified circuit 711 that includes a small resistor 718 integrated onto the gate of a MOSFET 719. In some implementations, the MOSFET 719 is similar to the MOSFET 712b, and the resistor 718 is utilized to represent an ON-state memristor. If the input signal is applied to a small weighted synapse S, it can be programmed to large weight. FIG. 7F shows that a sequence of input pulses (represented by curve 732) leads to the program of the synapses in FIG. 7E (the first and second spikes in curve 734) and make the stuck-ON neuron fire every time (represented by curve 736).

As described in greater detail below, a fully capacitive associative learning neural network is built using volatile memcapacitors, to exploit the learning mechanism in a time-division multiplexing scheme. Other networks have been previously realized by non-capacitive elements, e.g., including memristors, to show fundamental learning processes like classical conditioning. In classical conditioning, associative learning involves repeatedly pairing an unconditioned stimulus, which always triggers a reflexive response, with a neutral stimulus, which normally triggers no response. An association is developed between neural stimulus and unconditioned stimulus after training so the response can be triggered by either the unconditioned stimulus or the neutral stimulus, so that the latter becomes a conditioned stimulus.

FIGS. 5A-5F illustrate an example of a fully capacitive associative learning neural network 500 and simple classifier. The neural network 500 includes a postsynaptic memcapacitor neuron 510 and two non-volatile memcapacitor synapses $S_1$ and $S_2$. The memcapacitor neuron 510 includes a memcapacitor 514 that is integrated into the gate of a MOSFET 512.

Figures 5A, 5B, 5C, 5D, 5E, 5F:
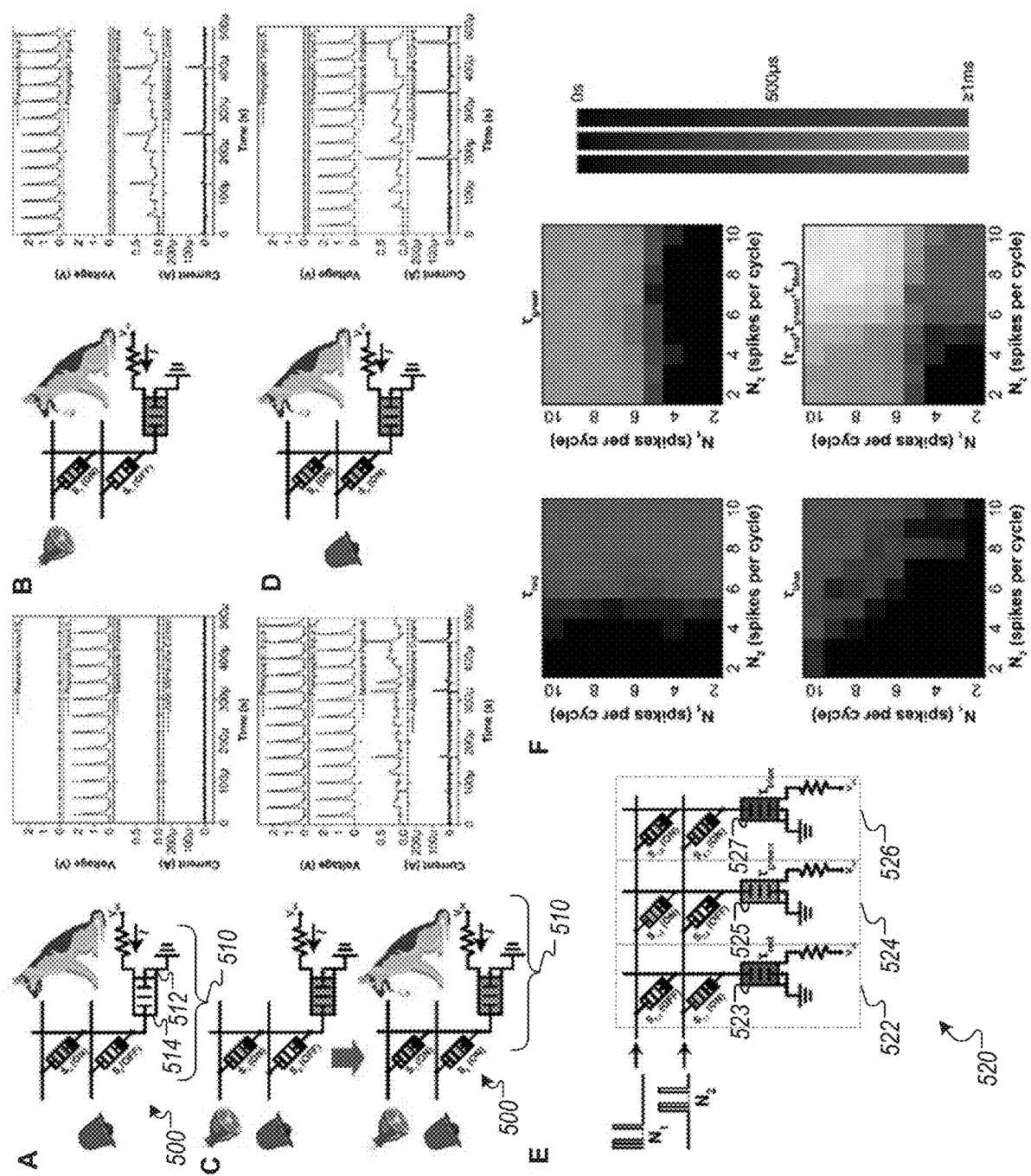
FIGS. 5A-5F illustrate an example of a fully capacitive associative learning neural network and simple classifier.

As shown by FIGS. 5A-5D, the two presynaptic neurons $S_1$ and $S_2$ are represented by voltage sources, and they model the sight of food and the sound of bell, respectively. The postsynaptic memcapacitor neuron 510 models the salivation of a dog. The initial capacitance weight of the memcapacitor interfacing with the "food" presynaptic neuron $S_1$ is large, while the initial capacitance weight of the memcapacitor connected to "bell" presynaptic neuron $S_2$ is small. FIGS. 5A and 5B illustrate the "probing phase" before the association, in which individual bell or food stimulus, respectively, is fed to the corresponding neurons $S_2$ and $S_1$. The fire of "salivation" postsynaptic memcapacitor neuron is only triggered by the "food" signal, as shown in FIG. 5B, rather than by the "bell" signal shown in FIG. 5A, as the large capacitance weight of the "food" synapse $S_1$ results in sufficient voltage drop across the "salivation" memcapacitor neuron, which integrates and fires. No memcapacitor synaptic weight changes in the probing stage. In some implementations, the associative neural network is symmetrical. The signals of stimuli could be swapped with affiliated synaptic weights, which contrast to asymmetric schemes in which inputs cannot be exchanged.

The process of associative learning is depicted in FIG. 5C, in which simultaneous "food" and "bell" stimuli are applied for a sufficiently long period of time. The "salivation" postsynaptic memcapacitor neuron 510 fires due to the stimulus from the "food" channel. The volatile memcapacitor neuron shows a short and stochastic relaxation time due to its underlying dynamics. In some implementations, a relaxation process lasts for more than one spike, e.g., 20 µs in FIG. 5C. Once elongated relaxation takes place, a back-propagating signal due to the fire of the "salivation" neuron 510 can overlap with forward propagating voltage spikes from the "bell" neuron $S_1$, yielding a sufficiently large voltage to potentiate the "bell" memcapacitor synapse and thus the association between "bell" and "salivation". As shown in FIG. 5D, which illustrates probing after the conditioning phase, the association is verified with only the "bell" stimulus, which successfully triggers the fire of the "salivation" memcapacitor neuron. As described further by the information with respect to FIG. 9, described below, the implementation of the classical conditioning verifies the Hebbian-like mechanism.

Figures 9A, 9B, 9C:
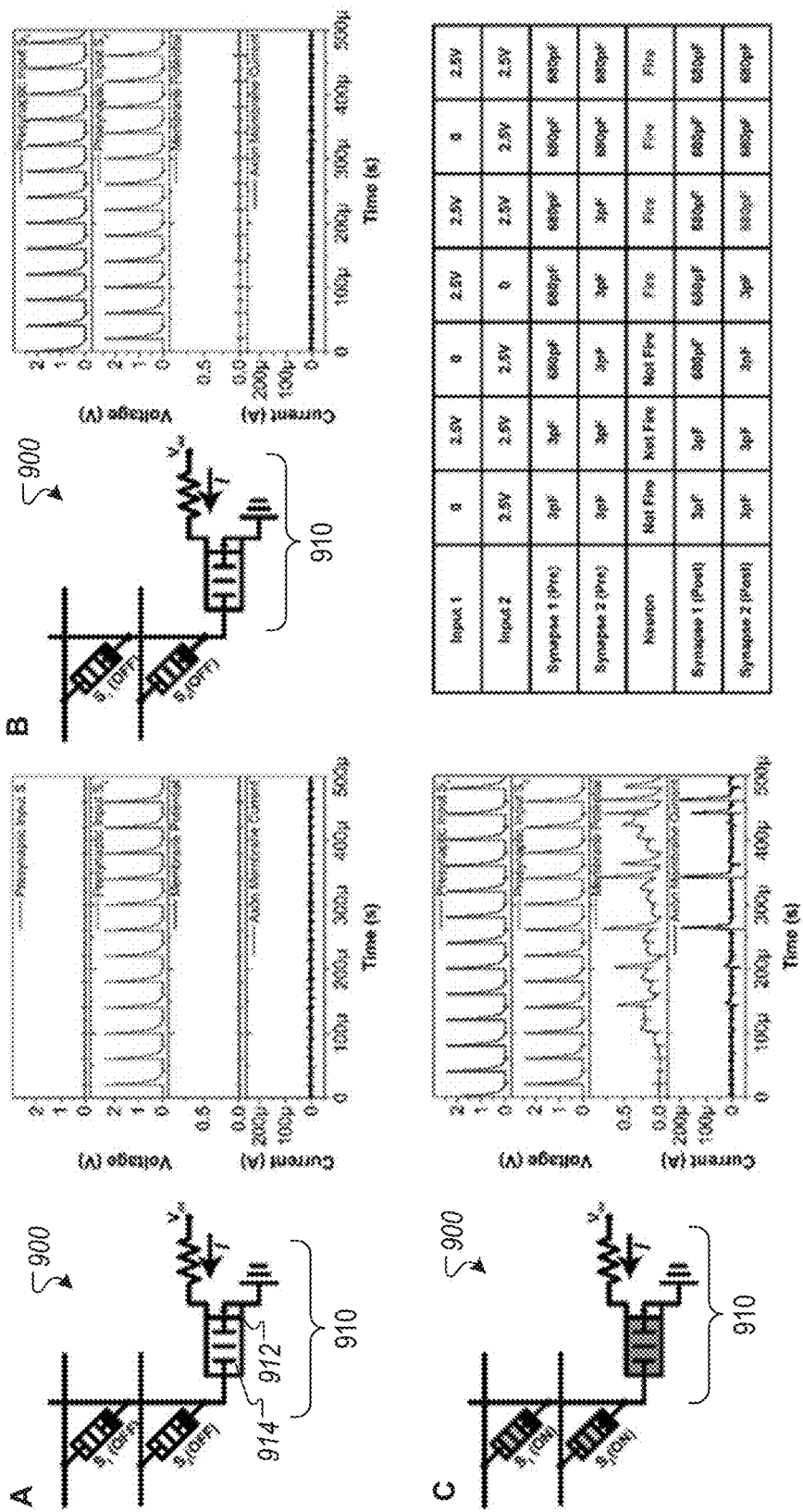
FIGS. 9A-9C provide an example of a demonstration of Hebbian-like mechanism on a fully capacitive neural network.

FIGS. 9A-9C provide an example of a demonstration of Hebbian-like mechanism on a fully capacitive neural network 900. The neural network 900 includes a postsynaptic memcapacitor neuron 910 and two non-volatile memcapacitor synapses $S_1$ and $S_2$. The memcapacitor neuron 910 includes a memcapacitor 914 that is integrated into the gate of a MOSFET 912. In some implementations, the neural network 900 is an example of the neural network 500, with the memcapacitor neuron 910 being an example of the memcapacitor neuron circuit 510.

FIG. 9A shows a condition in which a presynaptic stimulus is applied to synapse $S_2$ only. Both synapses $S_1$ and $S_2$ are with low initial weights, e.g., low capacitance values. The memcapacitor neuron 910 does not fire and none of the synapses $S_1$ or $S_2$ is programmed. FIG. 9B shows a condition in which presynaptic stimuli are applied to both synapses, where $S_1$ and $S_2$ have low initial weights, e.g., low capacitance values. The memcapacitor neuron 910 does not fire and none of the synapses is programmed. FIG. 9C shows a condition in which presynaptic stimuli are applied to both synapses, where $S_1$ and $S_2$ are initially with high weights, e.g., high capacitance values. The memcapacitor neuron 910 fired. There is, however, no programming of the synapses as both synapses are with the maximum weights.

Classification

Besides associative learning, input clustering can be visualized by feeding analog input vectors encoded by spiking rates with a trained capacitive neural network, e.g., as shown in FIG. 5E, which illustrates an example schematic of a 2×3 neural network 520 as a simple classifier of a two-dimensional input vector. The 2×3 neural network 520 is formed by combining three 2×1 neural networks 522, 524 and 524. In some implementations, each of the neural networks 522, 524 and 524 is an example of the neural network 500, with each including a postsynaptic memcapacitor neuron and two non-volatile memcapacitor synapses, with the memcapacitor neuron including a memcapacitor that is integrated into the gate of a MOSFET, as described with respect to the neural network 500. For example, the neural network 522 includes a memcapacitor neuron 523 and two non-volatile memcapacitor synapses $S_{1,1}$, $S_{2,1}$; the neural network 524 includes a memcapacitor neuron 525 and two non-volatile memcapacitor synapses $S_{1,2}$, $S_{2,2}$; and the neural network 526 includes a memcapacitor neuron 525 and two non-volatile memcapacitor synapses $S_{1,3}$, $S_{2,3}$. In some implementations, each of the memcapacitor neurons 523, 525 and 537 is an example of the memcapacitor neuron 510.

In some implementations, the non-volatile memcapacitor synapses $S_{1,1}$, $S_{2,1}$, $S_{1,2}$, $S_{2,2}$, $S_{1,3}$ and $S_{2,3}$ are initialized to discrete states (e.g., different capacitance values as weights, which could be facilitated by the simple Hebbian rule demonstrated above). Non-overlapping voltage spikes at different rates ($N_1$ and $N_2$ spikes per period) are applied. The time taken to fire the volatile memcapacitor neurons is mapped to red, green, and blue.

Inputs to the network are mapped to the output space represented by the membrane integration time (e.g., time consumed before the first fire) by the three post neurons, as shown by the color maps in FIG. 5F, which illustrates color maps of the fire time measured by post-neurons as a function of the rates of the two input spiking trains. The combined color map of the charge flowing through the three neurons shows the input two-dimensional (2D) vector is mapped to a different color representation. This provides experimental verification of the feasibility of using a capacitive neural network as an energy saving alternative computing scheme.

Structural Information (SEM)

Figures 8A, 8B, 8C, 8D, 8E, 8F, 8G:
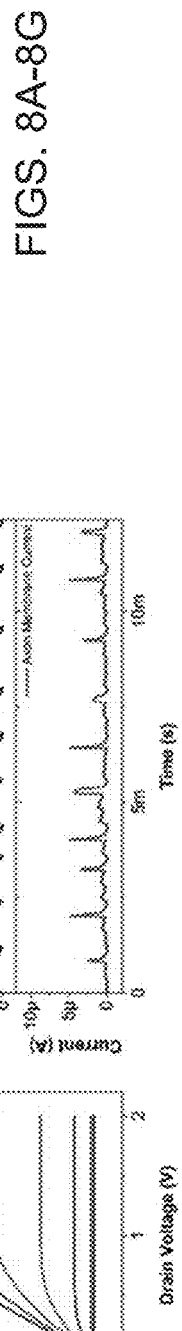
FIGS. 8A-8G illustrate an example of a fully integrated small-scale capacitive neural network.

In some implementations, the spatially correlated leaky integration and fire is realized on a single device. FIGS. 8A-8G illustrate an example of a fully integrated small-scale capacitive neural network. FIG. 8A shows a scanning electron micrograph 810 of a mini neural network as including an integrated memcapacitor neuron and two integrated memcapacitor synapses. As shown, the memcapacitor neuron sits on the gate of a conventional n-MOSFET and receives signal from the dendritic non-volatile memcapacitor synapses. The architecture parallels with the biological neural network. FIGS. 8B and 8C illustrate examples of scanning electron micrographs 820 and 830, respectively, of the integrated volatile memcapacitor neuron and the non-volatile synapse. In some implementations, both memcapacitors are realized by Ag-based memristors with series capacitance, subjecting to differences in material systems including Ag concentration and dielectric gap. As described with respect to FIG. 6, nonvolatile binary switching of the capacitance is observed on the integrated synapses, with an OFF-state capacitance of approximately 1 pF and an ON state capacitance of approximately 25 pF.

Electrical Properties

The transfer characteristics of a conventional n-MOSFET integrated to the volatile memcapacitor neuron is shown by the example graphs of FIGS. 8D and 8E The built-in diffusive memristor shows an abrupt switching of resistance upon a threshold of approximately 0.5V, and spontaneous conductance relaxation on removing the bias, as indicated by FIG. 8F. Symmetric hysteresis loops are observed with the opposite polarity bias. FIG. 8G shows the memcapacitor neuron integrate and fire with a train of spikes stimulating a large weight synapse. The integrated mini network is compatible with conventional CMOS fabrication processes, which can lead to realization of large-scale neural systems.

In this manner, the above sections describe that volatile memcapacitor neurons have biomimetic properties, exhibiting stochastic leaky integrate-and-fire behaviors. Active operations of the neuron cells are realized by gate field effect, which enables sustainable signal propagation in artificial neural networks with passive synapses. Capacitive synapses can be used for parallel dendritic spatial and temporal summation. Paired with non-volatile memcapacitors, a fully capacitive neural network can exhibit Hebbian-like learning mechanism, which has applications in associative learning and pattern classification, among other uses.

Exemplary Method of Fabrication of Volatile Memcapacitor

In some implementations, a vertical stack of a diffusive memristor and a capacitor is patterned by conventional photolithography on a p-type silicon (Si) wafer with 100 nanometers (nm) thermal oxide. Pt bottom electrodes (BE) of 20 nm thickness are evaporated onto the silicon dioxide ($SiO_2$) substrate with a 2 nm thick titanium (Ti) adhesion layer. A 10 nm thick blanket $Ta_2O_5$ dielectric layer is deposited by sputtering a $Ta_2O_5$ target in argon (Ar) and oxygen ($O_2$) plasma as the dielectrics of the series capacitor. The middle electrode (ME) consists of a Ta-rich $TaO_x$ layer grown by evaporating 10 nm Ta covered by another 20 nm evaporated Pt. A 10 nm $SiO_x$ buffer layer is grown by sputtering a $SiO_2$ target in Ar plasma and then treated by reactive ion etching (mixed trifluoromethane ($CHF_3$) and $O_2$ gas plasma) to form contact holes to the middle electrodes. The holes are then filled with a 2 nm sputtered Ag layer. A 10 nm thick $SiO_x$:Ag switching layer of the diffusive memristor is deposited by co-sputtering $SiO_2$ and Ag targets in Ar. Top electrodes (TE) of 2 nm Ag and 30 nm thick Pt are evaporated on the switching layer.

Exemplary Method of Fabrication of Active Volatile Memcapacitor Neuron

In some implementations, the diffusive memristor is fabricated in a similar manner as described in the preceding section with the volatile memcapacitor by leaving out the series capacitor. The active neuron based on a discrete device is constructed by wiring the bottom electrode of the diffusive memristor to the gate of the requisite transistors (e.g., transistors BSH103 and BSH203 from Nexperia USA Inc.).

Exemplary Method of Fabrication of Fully Integrated Memcapacitor Network

In some implementations, the bottom metal of the diffusive memristor is patterned on the gate of the transistor, followed by tetrafluoromethane ($CF_4$) reactive ion etching to remove native oxide. A 2/4/15/5 nm thickness Ti/Ag/Au/Pt electrode is evaporated on the naked gate (where Au is the symbol for gold). A 10 nm thick $SiO_2$ passivation layer is deposited to cover the gate. Contact holes to the bottom electrodes of the diffusive memristor are etched by $CHF_3$ and $O_2$ plasma. The contact holes are filled with 2 nm Ag. A 10 nm thick $SiO_x$:Ag switching layer of the diffusive memristor is patterned and deposited by co-sputtering $SiO_2$ and Ag targets in Ar. Top electrodes of 2 nm Ag and 30 nm thick Pt are patterned and evaporated. The non-volatile memcapacitor synapses are grown on the extended top electrode of the volatile memcapacitor neuron. An 8 nm hafnium oxide ($HfO_2$) atomic layer deposition (ALD) dielectric layer providing series capacitance is grown and patterned, followed by 2/20 nm Cr/Pt (Cr is the symbol for chromium) as the bottom electrodes for the Ag based electrochemical metallization cells. The 10 nm thick $SiO_x$:Ag switching layer of the metallization cells is deposited by co-sputtering $SiO_2$ and Ag targets in Ar. Top electrodes of 10 nm Ag and 100 nm thick palladium (Pd) are patterned and sputtered.

Example Electrical Measurements

As an illustrative example, in one implementation, electrical measurements of the charge-voltage characteristics of the volatile memcapacitor have been performed on a Keysight B1500A semiconductor device analyzer equipped with a B1530A waveform generator/fast measurement unit (WGFMU). A triangular waveform with 0.016V/μs slope was employed. The stored charge was calculated by integrating the sensed current over time.

Characterization of the active memcapacitor neuron has been performed using the Keysight 33622A arbitrary waveform generator and the Keysight MSOX3104 mixed signal oscilloscope. The oscilloscope probes are of capacitance much smaller than that of the low capacitance state of the volatile memcapacitor (e.g. gate capacitance of the transistor). Presynaptic signals were applied using the built-in waveforms of the Keysight 33622A. The analog oscilloscope channels were used to measure the voltage at the output of the function generator, drain of the transistor, and that across the volatile memcapacitor.

For the demonstration of the associative neural network, the 2×1 non-volatile memcapacitor synapses were interfaced with the volatile memcapacitor neuron. A time-division multiplexing scheme was employed, such that the presynaptic signal to the upper synapse would be active in the first period (e.g. 20 μs) while the input to the lower synapse (always at zero potential in this period) would be high-Z. This was reversed in the next period of 20 μs. The floating input was only active when the input signal was at zero potential, which maps "0" to high-Z equivalently. The high-Z input impedance was realized with series AD8180 multiplexers (from Analogy Devices. Inc.), connecting the presynaptic signal outputs from the Keysight 33622A.

Although a few implementations have been described in detail above, other modifications are possible. In addition, other components can be added to, or removed from, the described diffusive memristor and the diffusive memristor based true random number generator device. Accordingly, other implementations are within the scope of the following claims.

What is claimed is:

1. An apparatus comprising:
a diffusive memristor; and
a capacitor integrated in series with the diffusive memristor,
wherein the apparatus exhibits volatile memcapacitive behavior.

2. The apparatus of claim 1, wherein the diffusive memristor is placed on top of the capacitor.

3. The apparatus of claim 1, wherein the diffusive memristor includes a bottom electrode, a top electrode, a metal-doped dielectric layer between the bottom electrode and the top electrode, and one or more layers of the metal sandwiched between the dielectric layer and at least one of the bottom electrode or the top electrode, and wherein
the bottom electrode includes one of platinum (Pt), titanium nitride (TiN), tantalum nitride (TaN), palladium (Pd), or tungsten (W),
the dielectric layer includes one of a silicon oxide ($SiO_x$), hafnium oxide ($HfO_x$), magnesium oxide ($MgO_x$), aluminum oxide ($AlO_x$), silicon oxynitride ($SiN_xO_y$), or tantalum oxide ($TaO_x$),
the metal includes one of silver (Ag), copper (Cu), lithium (Li), sodium (Na), or potassium (K), and
the top electrode includes one of platinum (Pt), titanium nitride (TiN), tantalum nitride (TaN), palladium (Pd), or tungsten (W).

4. The apparatus of claim 1, wherein the capacitor includes a bottom plate, a top plate, a first dielectric layer and a second dielectric layer, and wherein
the bottom plate includes one of platinum (Pt), titanium nitride (TiN), tantalum nitride (TaN), palladium (Pd), tungsten (W), or aluminum (Al),
the first dielectric layer includes one of tantalum pentoxide ($Ta_2O_5$), hafnium oxide ($HfO_x$), or titanium oxide ($TiO_x$),
the second dielectric layer includes one of a tantalum oxide ($TaO_x$), hafnium oxide ($HfO_x$), or titanium oxide ($TiO_x$), and
the top plate includes one of platinum (Pt), titanium nitride (TiN), tantalum nitride (TaN), palladium (Pd), tungsten (W), or aluminum (Al).

5. The apparatus of claim 4, wherein the apparatus is configured to control a gate potential of a metal-oxide-semiconductor field-effect transistor (MOSFET).

6. A device comprising:
a transistor; and
a memcapacitor integrated onto the gate of the transistor, wherein the memcapacitor exhibits volatile memcapacitive behavior, the memcapacitor including:
a diffusive memristor; and
a capacitor integrated in series with the diffusive memristor,
wherein a gate dielectric of the transistor is replaced with the capacitor of the memcapacitor.

7. The device of claim 6, wherein the transistor includes a MOSFET.

8. The device of claim 6, wherein the diffusive memristor is placed on top of the capacitor.

9. The device of claim 6, wherein the diffusive memristor includes a bottom electrode, a top electrode, a metal-doped dielectric layer between the bottom electrode and the top electrode, and one or more layers of the metal sandwiched between the dielectric layer and at least one of the bottom electrode or the top electrode, and wherein
the bottom electrode includes one of platinum (Pt), titanium nitride (TiN), tantalum nitride (TaN), palladium (Pd), or tungsten (W),
the dielectric layer includes one of a silicon oxide ($SiO_x$), hafnium oxide ($HfO_x$), magnesium oxide ($MgO_x$), aluminum oxide ($AlO_x$), silicon oxynitride ($SiN_xO_y$), or tantalum oxide ($TaO_x$),
the metal includes one of silver (Ag), copper (Cu), lithium (Li), sodium (Na), or potassium (K), and
the top electrode includes one of platinum (Pt), titanium nitride (TiN), tantalum nitride (TaN), palladium (Pd), or tungsten (W).

10. The device of claim 6, wherein the capacitor includes a bottom plate, a top plate, a first dielectric layer and a second dielectric layer, and wherein
the bottom plate includes one of platinum (Pt), titanium nitride (TiN), tantalum nitride (TaN), palladium (Pd), tungsten (W), or aluminum (Al),
the first dielectric layer includes one of tantalum pentoxide ($Ta_2O_5$), hafnium oxide ($HfO_x$), or titanium oxide ($TiO_x$),
the second dielectric layer includes one of a tantalum oxide ($TaO_x$), hafnium oxide ($HfO_x$), or titanium oxide ($TiO_x$), and
the top plate includes one of platinum (Pt), titanium nitride (TiN), tantalum nitride (TaN), palladium (Pd), tungsten (W), or aluminum (Al).

11. An artificial neuron device comprising:
a transistor;
a volatile memcapacitor that is configured to operate as an electrically floating gate of the transistor, the volatile memcapacitor including:
a diffusive memristor; and
a capacitor integrated in series with the diffusive memristor; and
one or more synaptic circuits that are coupled to the volatile memcapacitor.

12. The artificial neuron device of claim 11, wherein each synaptic circuit includes at least one of a fixed-value capacitor or a reconfigurable capacitor.

13. The artificial neuron device of claim 12, wherein the fixed-value capacitor has a fixed capacitance value, and
wherein the reconfigurable capacitor has an electrically programmable capacitance value.

14. The artificial neuron device of claim 11, wherein the transistor includes a MOSFET.

15. The artificial neuron device of claim 11, wherein the diffusive memristor includes a Pt/Ag/$SiO_x$:Ag/Ag/Pt diffusive memristor.

16. The artificial neuron device of claim 11, wherein the capacitor includes a Pt/$Ta_2O_5$/$TaO_x$/Pt capacitor.

17. A system comprising:
a first artificial neuron device and a second artificial neuron device, wherein each artificial neuron device includes:
a transistor;
a volatile memcapacitor that is configured to operate as an electrically floating gate of the transistor, the volatile memcapacitor including:
a diffusive memristor; and
a capacitor integrated in series with the diffusive memristor; and one or more synaptic circuits that are coupled to the volatile memcapacitor, wherein a synaptic circuit includes at least one of a fixed-value capacitor or a reconfigurable capacitor, wherein a gate voltage of the first artificial neuron device is controlled by a first presynaptic signal, and wherein a gate voltage of the second artificial neuron device is a weighted sum of a drain voltage of the first artificial neuron device and a second presynaptic signal.

18. The system of claim 17, wherein the transistor included in the first artificial neuron device is one of an n-MOSFET or a p-MOSFET, and the transistor included in the second artificial neuron device is one of a p-MOSFET or an n-MOSFET.

19. The system of claim 17, wherein each synaptic circuit includes at least one of a fixed-value capacitor or a reconfigurable capacitor, wherein the fixed-value capacitor has a fixed capacitance value, and wherein the reconfigurable capacitor has an electrically programmable capacitance value.

20. The system of claim 17, wherein the diffusive memristor includes a $Pt/Ag/SiO_x:Ag/Ag/Pt$ diffusive memristor, and the capacitor includes a $Pt/Ta_2O_5/TaO_x/Pt$ capacitor.

* * * * *

UNITED STATES PATENT AND TRADEMARK OFFICE
CERTIFICATE OF CORRECTION

PATENT NO. : 10,740,672 B2  
APPLICATION NO. : 16/371736  
DATED : August 11, 2020  
INVENTOR(S) : Jianhua Yang et al.

Page 1 of 1

It is certified that error appears in the above-identified patent and that said Letters Patent is hereby corrected as shown below:

On the Title Page

Column 1, in the Title:  
Delete "CAPACITATIVE" and insert -- CAPACITIVE --, therefor.

Column 1, the Assignee:  
Delete "Univerity" and insert -- University --, therefor.

In the Specification

Column 1, Line 1:  
Delete "CAPACITATIVE" and insert -- CAPACITIVE --, therefor.

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*